United States Patent
Kulshreshtha et al.

(10) Patent No.: US 10,734,232 B2
(45) Date of Patent: Aug. 4, 2020

(54) DEPOSITION OF METAL SILICIDE LAYERS ON SUBSTRATES AND CHAMBER COMPONENTS

(71) Applicant: Applied Materials, Inc., Santa Clara, CA (US)

(72) Inventors: Prashant Kumar Kulshreshtha, San Jose, CA (US); Jiarui Wang, San Jose, CA (US); Kwangduk Douglas Lee, Redwood City, CA (US); Milind Gadre, Santa Clara, CA (US); Xiaoquan Min, Mountain View, CA (US); Paul Connors, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 15/977,388

(22) Filed: May 11, 2018

(65) Prior Publication Data
US 2018/0330951 A1 Nov. 15, 2018

Related U.S. Application Data

(60) Provisional application No. 62/505,672, filed on May 12, 2017.

(51) Int. Cl.
*H01L 21/225* (2006.01)
*G03F 1/38* (2012.01)
(Continued)

(52) U.S. Cl.
CPC .......... *H01L 21/2257* (2013.01); *C23C 16/24* (2013.01); *C23C 16/42* (2013.01);
(Continued)

(58) Field of Classification Search
None
See application file for complete search history.

(56) References Cited

U.S. PATENT DOCUMENTS 6,037,265 A   3/2000  Mui et al.
7,442,648 B2  10/2008 Kim et al.
(Continued)

FOREIGN PATENT DOCUMENTS

KR   20050013817 A   2/2005

OTHER PUBLICATIONS

International Search Report and Written Opinion dated Nov. 13, 2018 for PCT/US2018/032267.

*Primary Examiner* — Mounir S Amer
(74) *Attorney, Agent, or Firm* — Patterson + Sheridan LLP

(57) ABSTRACT

Embodiments of the present disclosure generally relate to methods and apparatus for depositing metal silicide layers on substrates and chamber components. In one embodiment, a method of forming a hardmask includes positioning the substrate having a target layer within a processing chamber, forming a seed layer comprising metal silicide on the target layer and depositing a tungsten-based bulk layer on the seed layer, wherein the metal silicide layer and the tungsten-based bulk layer form the hardmask. In another embodiment, a method of conditioning the components of a plasma processing chamber includes flowing an inert gas comprising argon or helium from a gas applicator into the plasma processing chamber, exposing a substrate support to a plasma within the plasma processing chamber and forming a seasoning layer including metal silicide on an aluminum-based surface of the substrate support.

20 Claims, 7 Drawing Sheets

(51) Int. Cl.
*H01L 21/033* (2006.01)
*C23C 16/42* (2006.01)
*C23C 16/24* (2006.01)
*C23C 16/455* (2006.01)
*H01L 21/3205* (2006.01)
*H01L 21/768* (2006.01)

(52) U.S. Cl.
CPC .......... *C23C 16/45538* (2013.01); *G03F 1/38* (2013.01); *H01L 21/0332* (2013.01); *H01L 21/32053* (2013.01); *H01L 21/76876* (2013.01)

(56) References Cited

U.S. PATENT DOCUMENTS

| | | | |
|---|---|---|---|
| 10,312,137 B2* | 6/2019 | Venkatasubramanian | ................... H01L 27/11556 |
| 10,529,568 B2* | 1/2020 | Roy | ................. H01L 21/02175 |
| 2006/0124587 A1 | 6/2006 | Lee | |
| 2006/0197177 A1* | 9/2006 | Yeom | ................. H01L 27/10894 257/510 |
| 2009/0280628 A1 | 11/2009 | Vellaikal et al. | |
| 2012/0264306 A1 | 10/2012 | Wu et al. | |
| 2016/0013070 A1* | 1/2016 | Jeon | ................. H01L 21/31116 438/478 |

* cited by examiner

DEPOSITION OF METAL SILICIDE LAYERS ON SUBSTRATES AND CHAMBER COMPONENTS

CROSS-REFERENCE TO RELATED APPLICATIONS

This application claims benefit of U.S. provisional patent application Ser. No. 62/505,672, filed May 12, 2017, which is herein incorporated by reference.

BACKGROUND

Field

Embodiments of the present disclosure generally relate to the fabrication of integrated circuits. More particularly, the embodiments described herein provide techniques for depositing metal silicide layers on substrates and chamber components.

Description of the Related Art

Hardmasks are used to transfer patterns for photolithography. Methods of forming a hardmask on a substrate are well-known in the art. There is a continual need for hardmasks that can deliver high aspect-ratio, non-collapsing etch-selective structures, which enables next generation devices to utilize vertical stack schemes to achieve higher device density and lower cost. Tungsten-based hardmasks have shown promise for meeting this need due to high modulus of elasticity, high density, excellent etch-selectivity, and ease of stripping. For example, amorphous tungsten hardmasks demonstrate greater than two times higher etch selectivity and mechanical stability when compared to conventional amorphous carbon-based films. However, fluorine from thick tungsten-based layers often quickly thermally diffuses into the interface of the substrate and the bulk film, making it infeasible to conventionally deposit thick layers. Further, tungsten-based films have poor adhesion to films made of silicon oxide, silicon nitride, amorphous silicon, and polysilicon that are commonly deposited on substrates. Thus, deposition of tungsten-based films is currently limited to thin layers that are typically used as gap-fill for high-aspect-ratio applications.

Additionally, when chambers having tungsten films deposited on components are cleaned after deposition using plasma of fluorine-based cleaning agents, fluoride ions react with aluminum in the chamber, for example with aluminum nitride (AlN) used to fabricate heaters. The reactions form aluminum fluoride ($AlF_x$), which causes process drifts and particle generation on the substrates. $AlF_x$ on substrates makes the substrates defective and cleaning thereof less effective due to sublimation to the showerhead or wall in the chamber. Thus, $AlF_x$ contamination and flaking is generally not desirable.

Thus, there is a need for improved methods and apparatus for forming thick tungsten-based hardmasks on substrates and preventing defects from $AlF_x$ contaminating the chamber components.

SUMMARY

Embodiments of the present disclosure generally relate to methods and apparatus for depositing metal silicide layers (for example, tungsten silicide) on substrates and chamber components. In one embodiment, a method of forming a hardmask by depositing a metal silicide layer on a substrate is disclosed. The method includes positioning the substrate having a target layer within a processing chamber, forming a seed layer of metal silicide on the target layer and depositing a tungsten-based bulk layer on the seed layer, wherein the metal silicide layer and the tungsten-based bulk layer form the hardmask.

In another embodiment, a method of conditioning the components of a plasma processing chamber by depositing a metal silicide layer on chamber components is disclosed. The method includes flowing an inert gas from a gas applicator into the plasma processing chamber, exposing a substrate support to a plasma within the plasma processing chamber and forming a seasoning layer of metal silicide on an aluminum-based surface of the substrate support. The inert gas includes argon or helium.

In yet another embodiment, a processing chamber is disclosed. The processing chamber includes a chamber body having a chamber volume defined within, a substrate support disposed within the chamber volume, a lid coupled to the chamber body, and a gas applicator fluidly connected to the chamber volume through the lid. The gas applicator includes a tubular body, a passage formed through the tubular body and fluidly coupled to the chamber volume, a first cross-hole, and a second cross-hole formed through the tubular body. The first cross-hole is configured to deliver a first gas into the passage. The second cross-hole is spaced axially below the first cross-hole relative to a centerline of the tubular body and configured to deliver a second gas into the passage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatus for depositing metal silicide layers on substrates and chamber components.

Embodiments described herein will be described below in reference to a PECVD process that can be carried out using any suitable thin film deposition system. Examples of suitable systems include the CENTURA® systems which may use a DXZ® processing chamber, PRODUCER® systems, PRODUCER® GT systems, PRODUCER® XP Precision™ systems and PRODUCER® SE™ systems which are commercially available from Applied Materials, Inc., of Santa Clara, Calif. Other tools capable of performing PECVD processes may also be adapted to benefit from the embodiments described herein. The apparatus described herein is illustrative and should not be construed or interpreted as limiting the scope of the embodiments described herein.

Seed layers (e.g., TiN, WSi, WB, WN films) deposited through atomic layer deposition (ALD) have shown good adhesion to silicon oxide and silicon nitride, but do not sufficiently adhere thick tungsten-based films to substrates. The embodiments described herein enable the formation of thick tungsten-based films that adhere well to substrates. Compared to conventional ALD films, the methods and apparatus described herein introduce more fluorine traps per unit thickness, which allow for deposition of thin seed layers that enhance the adhesion of the tungsten-based films to substrates. The methods use alternating gas flow pulses to reduce the grain size and roughness of the film and improve film adhesion. The gas flow of one or more gases (e.g., $H_2$, He, $B_2H_6$, hydrocarbons, $N_2$, $N_2O$, $NO_2$, $N_2O_4$, $NH_3$, $NF_3$, $SiH_4$, $Si_2H_6$, $CH_4$, $C_2H_2$, $C_3H_6$, $C_4H_8$, $C_5H_{10}$, $O_2$, $O_3$, $H_2O$, Ar, $WF_6$, $WCl_6$, $W(CO)_6$, and organometallic compounds of tungsten) can be alternated. The time intervals for each gas flow pulse can be the same or different, ranging, for example, from 0.1 to 100 seconds. The duration of each gas flow pulse may gradually decrease over a number of pulse cycles or gradually increase over a number of pulse cycles. Alternating gas flow pulses of different gases during the deposition process disrupts crystallization, which creates defects that trap fluorine and enables isotropic growth. Morphology and adhesion of the deposited films are improved due to smaller grain size and better chemical bonding at interfaces and within the deposited films.

The methods and apparatus disclosed herein describe the formation of a tungsten silicide layer as examples of a seasoning layer on chamber components and a seed layer for the deposition of tungsten-based bulk layers on substrates. It is to be noted, however, that the methods and apparatus disclosed herein are equally applicable to the formation of other metal silicide layers, such as but not limited to, molybdenum silicide, titanium silicide, etc.

Figure 1:
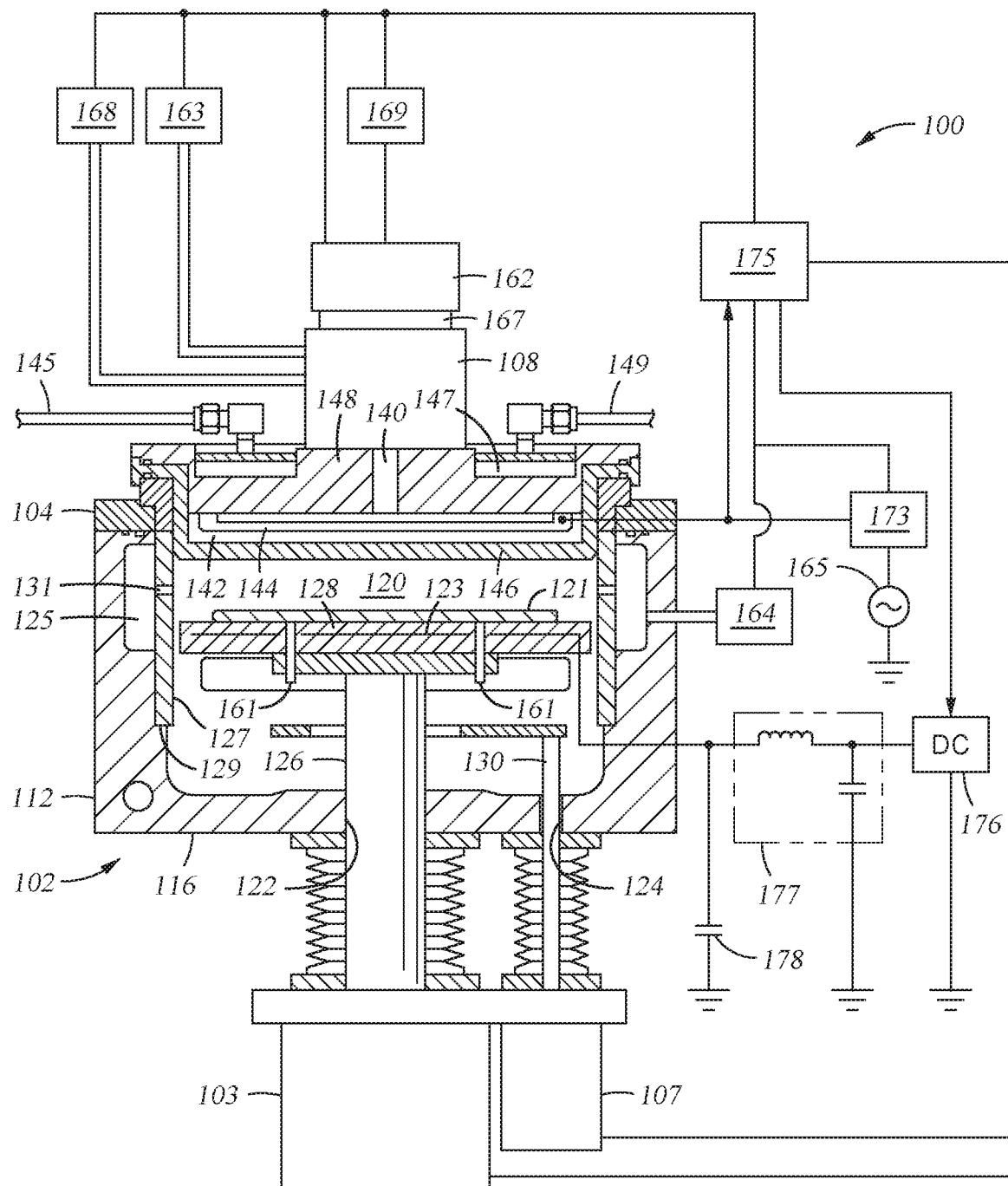
FIG. 1 depicts a simplified front cross-sectional view of a plasma enhanced chemical vapor deposition (PECVD) chamber that can be used to practice the embodiments described herein.

FIG. 1 depicts one example of a simplified front cross-sectional view of a PECVD chamber 100 in which the disclosed technology may be practiced. The chamber 100 generally includes a chamber body 102 supporting a chamber lid 104. The chamber lid 104 is attached to the chamber body 102 by a hinge (not shown). The chamber body 102 comprises sidewalls 112 and a bottom wall 116 which together with the chamber lid 104 bound an internal chamber volume 120. The chamber lid 104 is interfaced with a gas distribution system 108 for delivering reactant and/or cleaning gases into the chamber volume 120. A circumferential pumping channel 125 is formed in the sidewalls 112 and coupled to a pumping system 164. The pumping system 164 is configured for exhausting gases from the chamber volume 120 and controlling the pressure within the chamber volume 120. A substrate support 128 is disposed in the chamber volume 120. The substrate support 128 has a stem 126 that passes through a passage 122 formed through the bottom wall 116. A rod 130 configured to actuate substrate lift pins 161 passes through another passage 124 formed through the bottom wall 116. The rod 130 is coupled to an actuator 107.

The substrate support 128 is disposed in the chamber volume 120 and configured for supporting and holding a substrate 121 during processing. A drive system 103 is coupled to the substrate support 128 to lower or raise the substrate support 128 within the chamber volume 120. The drive system 103 is coupled to the substrate support 128 to lower or raise the substrate support 128 within the chamber volume 120.

In one embodiment, the substrate support 128 is an electrostatic chuck. The substrate support 128 includes at least one chucking electrode 123 to which a voltage is applied to electrostatically secure the substrate 121 thereon. The electrode 123 is powered by a direct current (DC) power supply 176 connected to the electrode 123 via a low pass filter 177. The electrode 123 in the substrate support 128 may be monopolar, bipolar, tripolar, interdigitated, zonal and the like. In another embodiment, the substrate support 128 does not include an electrostatic chuck.

In some embodiments, the substrate support 128 includes one or more heating elements 605 (shown in FIG. 6A-6B), such as resistive elements, to heat the substrate 121 positioned thereon to a desired process temperature. Alternatively, the substrate support 128 is heated by an outside heating element such as a lamp assembly. The heating elements 605 may also be used in embodiments wherein the substrate support 128 is configured as an electrostatic chuck.

A remote plasma source 162 is fluidly connected to the chamber volume 120 through a gas applicator 140 of the gas distribution system 108 and operated to generate ionized radicals during processing. The ionized radicals flow through a gas inlet passage 167 from the remote plasma source 162 into the gas distribution system 108. The remote plasma source 162 is connected to a gas source 169 which supplies a gas, such as a cleaning gas, into the remote plasma source 162.

At least two separate gas sources 163, 168 are coupled to the gas distribution system 108. The gas sources 163, 168 provide different gases that can be delivered through the gas applicator 140 into the chamber volume 120.

An RF power source 165 is coupled to a showerhead assembly 142 under the lid 104 through an impedance matching circuit 173. The showerhead assembly 142 is comprised of an annular base plate 148 having a blocker plate 144 disposed intermediate to a faceplate 146. The faceplate 146 of the showerhead assembly 142 and the electrode 123, which is grounded via a high pass filter, such as a capacitor 178, form a capacitive plasma generator. The RF power source 165 provides RF energy to the showerhead assembly 142 to facilitate generation of the capacitive plasma between the faceplate 146 of the showerhead assembly 142 and the substrate support 128. Thus, the electrode 123 provides both a ground path for the RF power source 165 and an electric bias from the DC power supply 176 to enable electrostatic clamping of the substrate 121 to the substrate support 128.

The RF power source 165 comprises a high frequency radio frequency (HFRF) power source, e.g., a 13.56 MHz RF generator, and/or a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

A chamber liner 127 made of ceramic or other suitable material is disposed in the chamber volume 120 to protect the sidewalls 112 from the corrosive processing environment. The chamber liner 127 is supported by a ledge 129 formed in the sidewalls 112. A plurality of exhaust ports 131 are formed on the chamber liner 127. The exhaust ports 131 are configured to fluidly connect the chamber volume 120 to the pumping channel 125.

Figure 2:
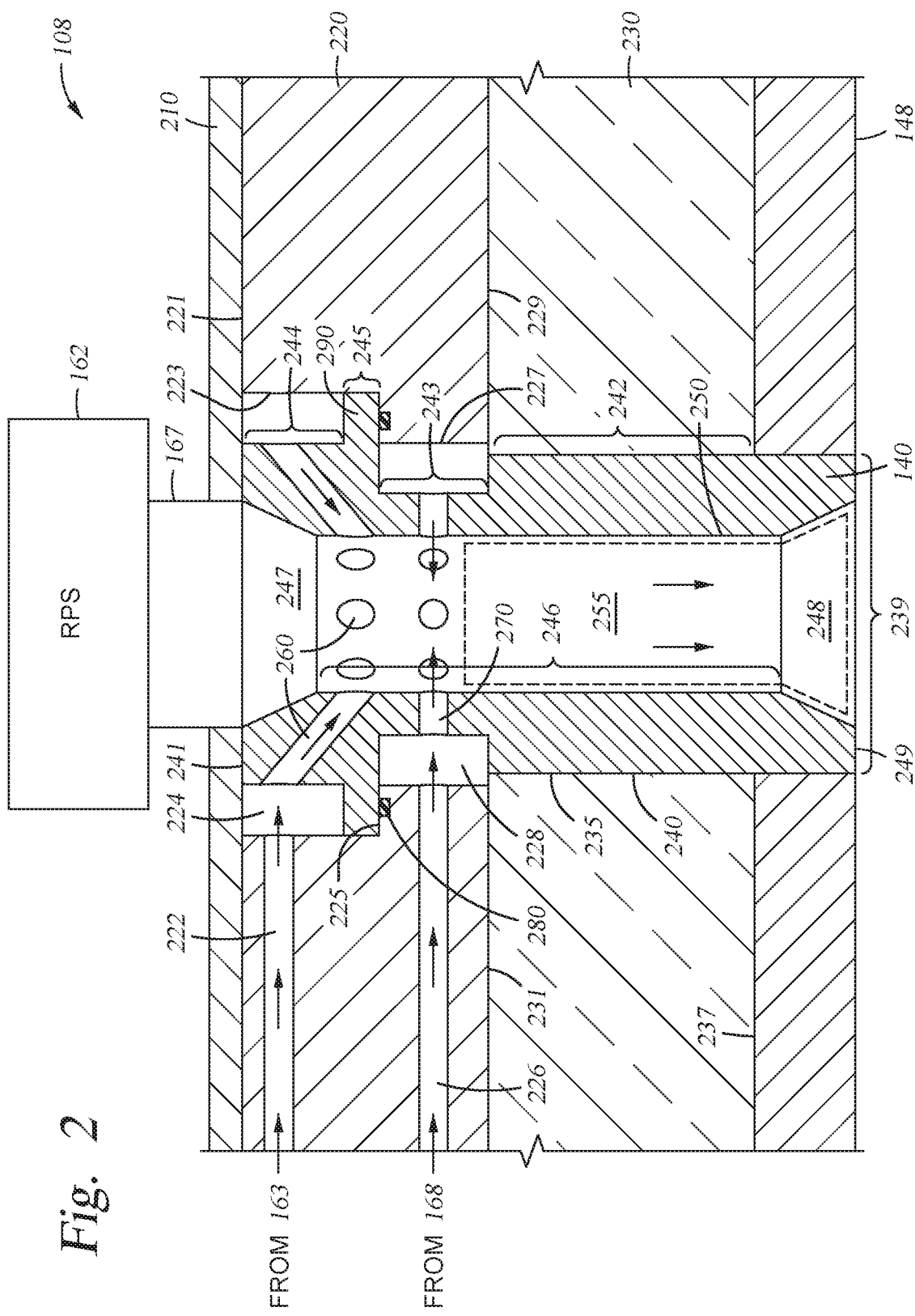
FIG. 2 depicts a partial cross-sectional view of a gas applicator of the chamber of FIG. 1, according to one embodiment of the disclosure.

FIG. 2 shows a partial cross-sectional view of the gas distribution system 108 disposed through the chamber lid 104 for delivering reactant and cleaning gases into the chamber volume 120. The gas distribution system 108 includes a lid 210, an output manifold 220, an isolator 230 and the gas applicator 140.

The output manifold 220 and the isolator 230 are stacked on top of each and have a passage 239 therethrough. The gas applicator 140 is disposed in the passage 239 such that its longitudinal axis is aligned co-linear with the longitudinal axis of the passage 239. A top end of the passage 239 connects to the gas inlet passage 167. A bottom end of the passage 239 connects to the chamber volume 120 and faces the showerhead assembly 142, as shown in FIG. 1. The output manifold 220 has a top surface 221 and a bottom surface 229. The top surface 221 is coupled to the lid 210. The bottom surface 229 is coupled to a top surface 231 of the isolator 230. The output manifold 220 has a first conduit 222 and a second conduit 226 that are coupled to separate gas sources 163, 168. The lid 210 covers the output manifold 220 and the gas applicator 140 at the top end. The lid 210 may cover a portion of the passage 239 to retain the gas applicator 140 within the passage 239.

The isolator 230 has the top surface 231 and a bottom surface 237. The top surface 231 is coupled to the bottom surface 229 of the output manifold 220. The bottom surface 237 is coupled to the base plate 148. The isolator 230 has an inner wall 235 that defines a portion of the passage 239. The inner wall 235 is configured to accommodate the gas applicator 140 within the passage 239. The isolator 230 is configured to provide thermal and electrical isolation to the gas applicator 140.

The gas applicator 140 is disposed in the passage 239. The gas applicator 140 has a central passage 255 that is configured to deliver a gas into the chamber volume 120. In one embodiment, the gas applicator 140 is cylindrically-shaped, but in other embodiments, the gas applicator 140 can have other cross-section of different shapes. The gas applicator 140 passes through the base plate 148 to allow the central passage 255 to fluidly connect to the chamber volume 120. The gas applicator 140 has an outer wall 240 and an inner wall 250. The inner wall 250 and the outer wall 240 meet at a top surface 241 of the gas applicator 140. The inner wall 250 and the outer wall 240 also meet at a bottom surface 249 of the gas applicator 140. The inner wall 250 bounds the central passage 255 that goes through the gas applicator 140. The inner wall 250 has a central portion 246, a first tapered portion 247 and a second tapered portion 248. The inner wall 250 connects to the gas inlet manifold 167 at the top end of the central passage 255 through the first tapered portion 247.

The inner wall 250 connects to the base plate 148 at the bottom end of the central passage 255 through the second tapered portion 248.

The outer wall 240 defines a portion of the passage 239 which runs through the output manifold 220 and the isolator 230 is disposed below the output manifold 220. The outer wall 240 has a first portion 242, a second portion 243, a third portion 245, and a fourth portion 244. The first portion 242 includes the inner wall 235 of the isolator 230. The second portion 243 is formed in the output manifold 220 and is connected to the first portion 242. The third portion 245 is connected to the second portion 243. The fourth portion 244 is connected to the third portion 245. The third portion 245 extends outwards and has a diameter greater than a diameter of first portion 242. The second portion 243 and the fourth portion 244 have diameters lesser than the first portion 242. The second portion 243 and the fourth portion 244 interface with a stepped hole of the output manifold 220. The stepped hole includes a first inner wall 223 connected by a step 225 to a second inner wall 227. A flange 290 outlined by third portion 245 is seated on the step 225. A seal 280, such as but limited to an O-ring, provides a seal between the gas applicator 140 and the output manifold 220 to prevent gas leakage around the flange 290. Thus, a lower plenum 228 is formed below the flange 290 between the second portion 243 and the inner wall 227 of the output manifold 220. Similarly, an upper plenum 224 is formed above the flange 290 between the fourth portion 244 and the inner wall 223 of the output manifold 220. The upper plenum 224 is fluidly connected to the gas source 163 by the conduit 222. The lower plenum 228 is fluidly connected to the gas source 168 by the conduit 226.

The gas applicator 140 has a first cross-hole 260 that is configured to fluidly connect the upper plenum 224 with the central passage 255. The gas applicator 140 may optionally have any suitable number of first cross-holes 260. The first cross-hole 260 may have a cross-sectional shape of a circle, square or other suitable geometry, such that the first cross-hole 260 can deliver a fluid effectively into the central passage 255. Additionally, the first cross-hole 260 may be formed at a radially inward and downward angle (towards bottom surface 249). The inward and downward angle of the first cross-hole 260 provides momentum to the fluid flow exiting the first cross-hole 260 into the central passage 255 in a direction towards the chamber volume 120 and away from the RPS 162. Thus, the angle of the first cross-hole 260 prevents backflow of the gases into the gas inlet passage 167 connected to the remote plasma source 162, thus reducing potential unwanted deposits and contamination. The gas applicator 140 has a second cross-hole 270 that is configured to fluidly connect the lower plenum 228 with the central passage 255 below the first cross-hole 260. The gas applicator 140 may optionally have any suitable number of second cross-holes 270. The second cross-hole 270 may have a cross-sectional shape of a circle, square or other geometry, such that the second cross-hole 270 can deliver a fluid into the central passage 255.

Referring back to FIG. 1, a cooling channel 147 is coupled to the base plate 148 of the gas distribution system 108 to cool the base plate 148 during operation. A cooling inlet 145 delivers a coolant fluid, such as water or the like, into the cooling channel 147. The coolant fluid exits the cooling channel 147 through a coolant outlet 149.

As shown in FIG. 1, the PECVD system 100 further includes a system controller 175, which controls the operation of the remote plasma source 162, the RF power source 165 and the DC power supply 176. The system controller 175 also controls the operation of the pumping system 164, the drive system 103, the actuator 107, and the gas sources 163, 168 and 169. The system controller 175 includes a central processing unit (CPU), a memory, and a support circuit. The CPU may be any form of general purpose computer processor that may be used in an industrial setting. The software routines can be stored in the memory, such as random access memory, read only memory, floppy, or hard disk drive, or other form of digital storage. The support circuit is conventionally coupled to the CPU and may include cache, clock circuits, input/output systems, power supplies, and the like.

The chamber 100 incorporating the gas applicator 140 is advantageously used to form metal silicide layers in the chamber volume 120 of the chamber 100. In one embodiment, a seasoning layer of tungsten silicide is formed on a component of the chamber 100, such as but not limited to the substrate support 128. In operation, the electrode 123 within the substrate support 128 is powered on by the DC power supply 176. The heating element 605 (shown in FIGS. 6A-6B) within the substrate support 128 is turned on to control the temperature of the substrate 121. An inert gas such as argon is supplied into the chamber volume 120 through the conduit 222 and the central passage 255 of the gas applicator 140. Alternatively or additionally, an inert gas such as helium may be supplied into the chamber volume 120 through the conduit 226 and the central passage 255 of the gas applicator 140. The inert gases are continually supplied to the chamber volume 120 and removed from the chamber volume 120 by the pumping system 164. A plasma (not shown) is generated in the chamber volume 120 by powering on the RF power source 165. The components of the chamber 100, including the substrate support 128 are exposed to the plasma.

In one example, tungsten hexafluoride is flowed into the chamber volume 120 for a predetermined interval of time through the gas applicator 140. Subsequently, the tungsten hexafluoride is removed from the chamber volume 120 by the pumping system 164 with or without introduction of an inert purge gas into the chamber volume 120. Then, silane is flowed into the chamber volume 120 for a predetermined interval of time through the gas applicator 140. Subsequently, the silane is removed from the chamber volume 120 by the pumping system 164, with or without introduction of an inert purge gas into the chamber volume 120. The sequence of introducing and removing tungsten hexafluoride and silane is repeated one or more times until a uniform layer of tungsten silicide is deposited on the substrate support 128 and other components of the chamber.

In another embodiment, a seed layer of tungsten silicide is formed on a substrate 121 disposed on the substrate support 128. The substrate 121 has a target layer disposed thereon. The target layer is a layer of material that will be later etched to form a portion of an integrated circuit device being formed on the substrate 1212. In some embodiments, the target layer is exposed to silane, before it is placed on the substrate support 128. The electrode 123 within the substrate support 128 is powered on by the DC power supply 176. The heating element 605 heats the substrate support 128 during processing. An inert gas such as argon is supplied into the chamber volume 120 through the conduit 222 and the central passage 255 of the gas applicator 140. Alternatively or additionally, an inert gas such as helium is supplied into the chamber volume 120 through the conduit 226 and the central passage 255 of the gas applicator 140. The inert gases are continually supplied to the chamber volume 120 and removed from the chamber volume 120 by the pumping system 164. Optionally, a plasma (not shown) is generated in the chamber volume 120 by powering on the RF power source 165. In that case, the substrate 121 having the target layer is exposed to the plasma.

In one example, tungsten hexafluoride is flowed into the chamber volume 120 for a predetermined interval of time through the gas applicator 140. If a plasma is used, the tungsten hexafluoride is mixed with argon. Subsequently, the tungsten hexafluoride and argon (if argon is used) is removed from the chamber volume 120 by the pumping system 164, with or without introduction of an inert purge gas. Silane is then flowed into the chamber volume 120 for another predetermined interval of time through the gas applicator 140. If a plasma is used, the silane is mixed with helium. Subsequently, the silane and helium (if helium is used) is removed from the chamber volume 120 by the pumping system 164, with or without introduction of an inert purge gas. The sequence of introducing and removing tungsten hexafluoride and silane is repeated one or more times until a uniform layer of tungsten silicide is deposited as a seed layer over the target layer. The plasma enhances the formation of the tungsten silicide layer. The seed layer is made rich in silicon content by reacting a higher proportion (51-99%) of silicon from silane with a lower proportion (1-49%) of tungsten from tungsten hexafluoride. A tungsten-based bulk layer is then deposited on the seed layer to form a hardmask. The tungsten-based bulk layer may optionally be doped with boron, carbon, nitrogen and/or silicon. The hardmask is used to develop a pattern on the substrate 121.

Figure 3:
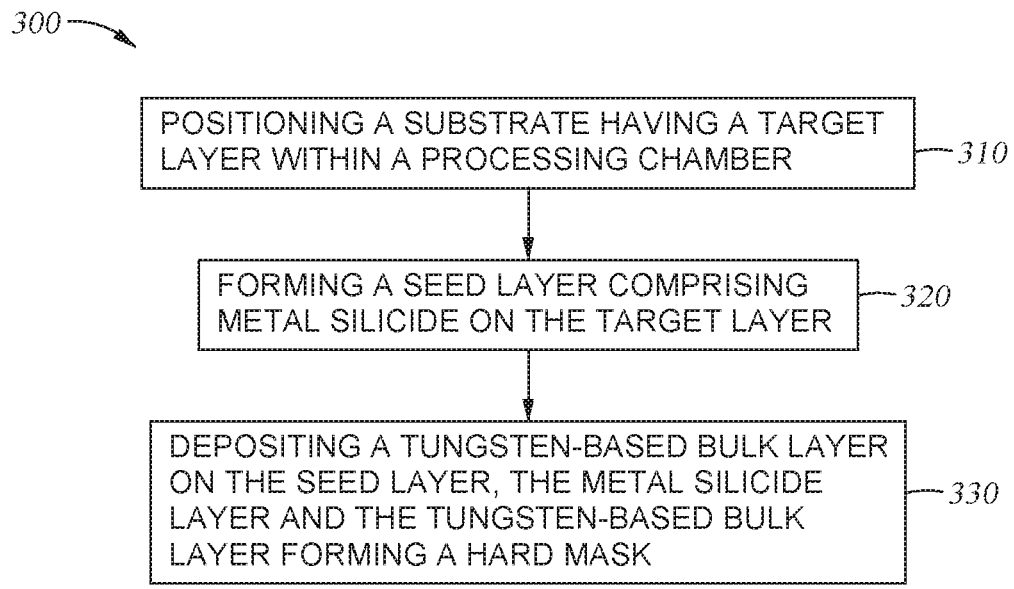
FIG. 3 is a block diagram of a method for forming a hardmask on a substrate placed in the chamber of FIG. 1, according to one embodiment of the disclosure.
Figure 4A:
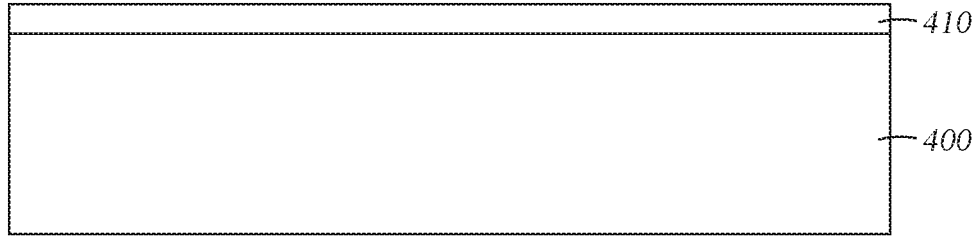
FIGS. 4A-4G depict the various stages of patterning a target layer on a substrate using a hardmask, according to one embodiment of the disclosure.

FIG. 3 is a block diagram of the method 300 of forming a hardmask on a substrate, according to one embodiment of the disclosure. The method 300 begins at block 310 by positioning a substrate having a target layer within a processing chamber. The target layer may be silicon oxide, silicon nitride, amorphous silicon, polysilicon, or another dielectric layer that will be the target of a subsequent etching process. In some embodiments, the substrate is positioned on a substrate support, such as but not limited to an electrostatic chuck disposed within the chamber. In some other embodiments, the substrate is positioned within a plasma processing chamber. In those embodiments, an inert gas comprising argon or helium is flowed into the chamber volume of the plasma processing chamber through a gas applicator. Subsequently, a plasma is energized within the processing chamber. As shown in FIG. 4A, a substrate 400 with a target layer 410 is placed inside a processing chamber, such as the processing chamber 100 described above.

At block 320, a seed layer is formed on the target layer. The seed layer comprises a metal silicide, such as but not limited to tungsten silicide, titanium silicide, or molybdenum silicide. In this disclosure, tungsten silicide is used as an example. In some embodiments, the target layer is exposed to silane prior to forming the seed layer. Additionally, in some embodiments, the seed layer comprising tungsten silicide is formed on the target layer in presence of plasma. The formation of the tungsten silicide layer involves several operations. In the first operation, tungsten hexafluoride is flowed from a gas applicator into the chamber volume of the processing chamber during a first interval of time. In the embodiments where a plasma is used, the tungsten hexafluoride is mixed with argon. In the second operation, the tungsten hexafluoride and argon (if argon is used) is removed from the processing chamber during a second interval of time, with or without introduction of an inert purge gas. In the third operation, silane is flowed from the gas applicator into the chamber volume of the processing chamber for a third interval of time. In the embodiments where plasma is used, the silane is mixed with helium. In the fourth operation, the silane and helium (if helium is used) is then removed from the processing chamber during a fourth interval of time, with or without introduction of an inert purge gas.

Figure 4B:
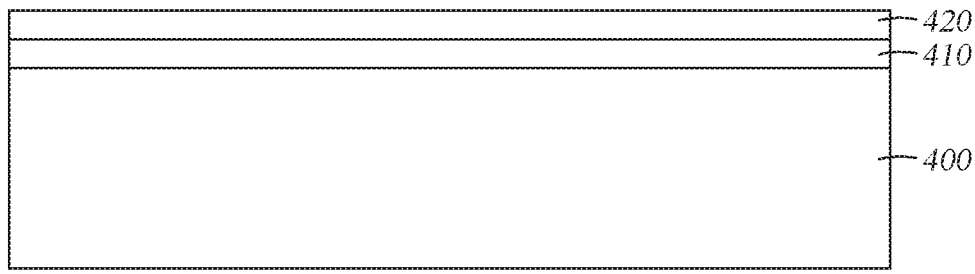

The first, the second, the third and the fourth intervals of time may have duration of between about 0.1 seconds to about 100 seconds. Combined, the first, the second, the third and the fourth intervals of time define a time cycle. In some embodiments, the first time interval and the third time interval are the same, are different, or change in duration with each time cycle. The time cycle including the first, the second, the third and the fourth operations is repeated a plurality of times until a layer of tungsten silicide is deposited on the target layer of the substrate to a desired thickness. FIG. 4B shows how a seed layer 420 comprising tungsten silicide is formed on the target layer 410. The thickness of the seed layer comprising tungsten silicide is between about 1 nm to about 100 nm. In some embodiments, the formed metal silicide seed layer is rich in silicon content with the density of the seed layer in the range of about 1.8 g/cc to about 15 g/cc at room temperature. The density of the tungsten silicide seed layer is between about 4.5 g/cc to about 10.0 g/cc at room temperature (compared to about 19.25 g/cc for tungsten and about 2.3 g/cc for amorphous silicon at room temperature). The skew of the tungsten silicide density towards the density of silicon rather than that of tungsten is indicative of a higher concentration of silicon than tungsten in the tungsten silicide seed layer, as compared to conventionally deposited tungsten silicide.

Figure 4C:
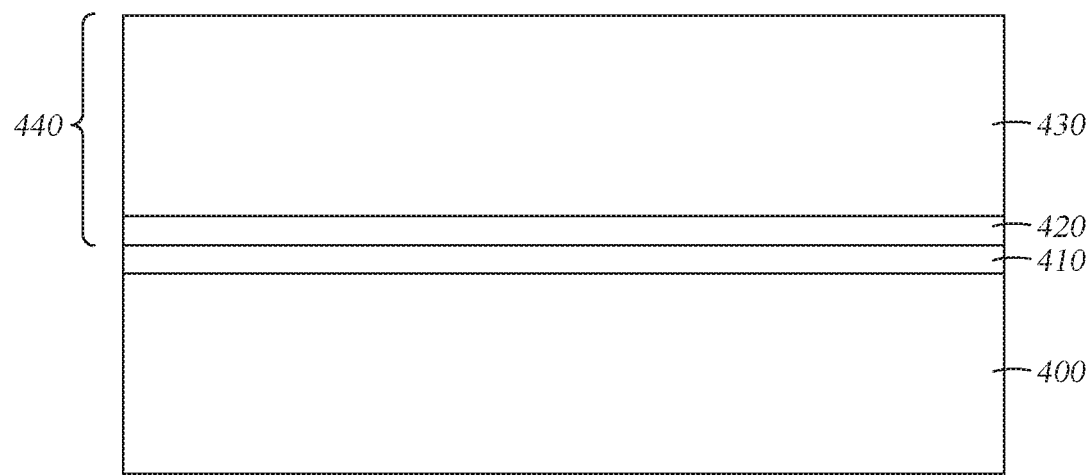

At block 330, a tungsten-based bulk layer is deposited on the seed layer. The seed layer made of tungsten silicide and the tungsten-based bulk layer together form a hardmask which may be later patterned and used to etch the target layer. As shown in FIG. 4C, a tungsten-based bulk layer 430 is deposited on the seed layer 420. The seed layer 420 and the tungsten-based bulk layer 430 together form a hardmask 440. The tungsten-based bulk layer 430 may be fabricated from one or more of tungsten, tungsten carbide, tungsten nitride, tungsten carbonitride, tungsten boron carbide, and tungsten boron nitride. The thickness of the tungsten-based bulk layer 430 is between about 10 nm to about 5 microns (5000 nm).

Figure 4D:
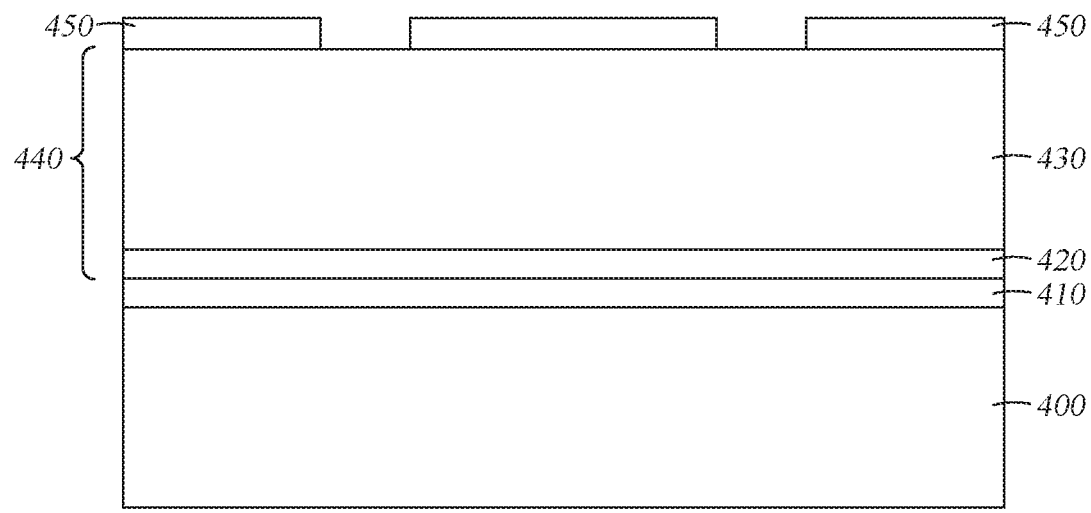
Figure 4E:
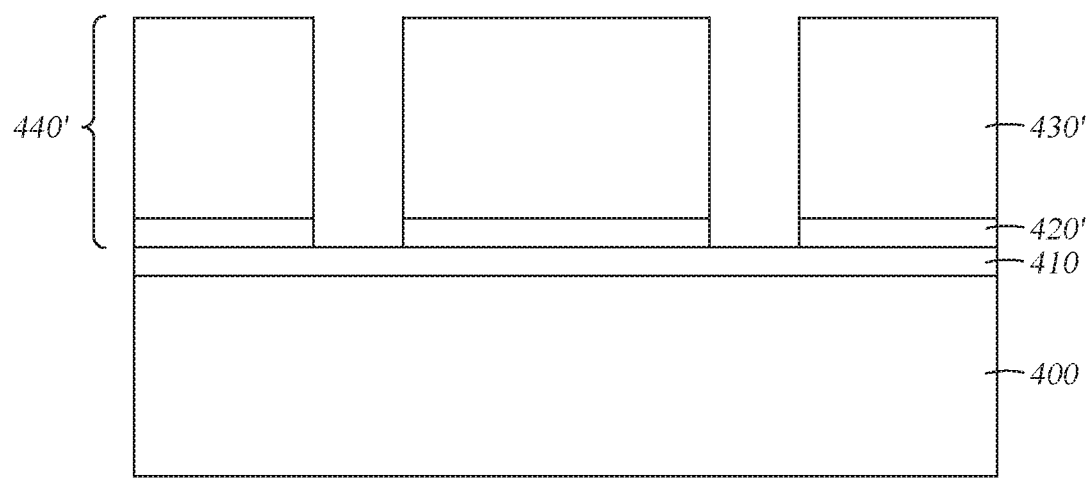
Figure 4F:
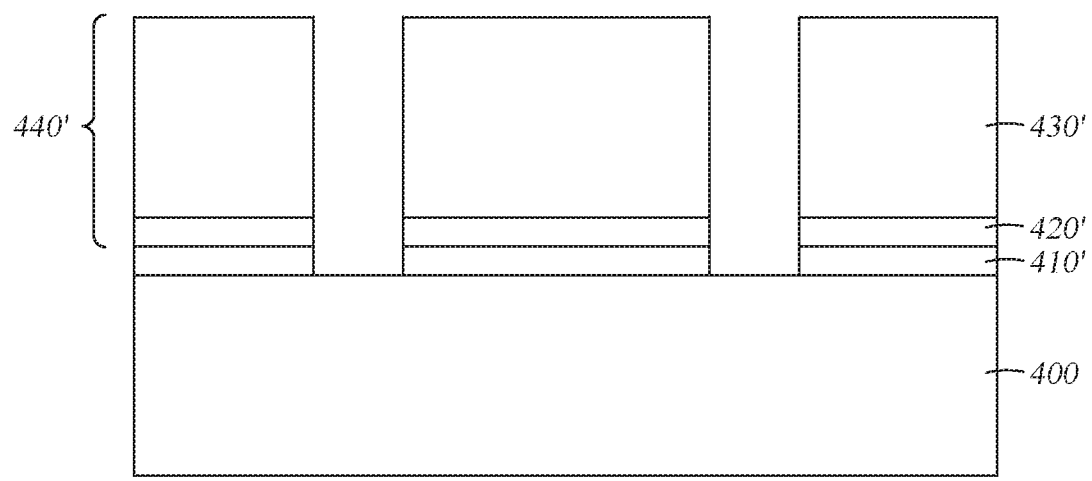
Figure 4G:
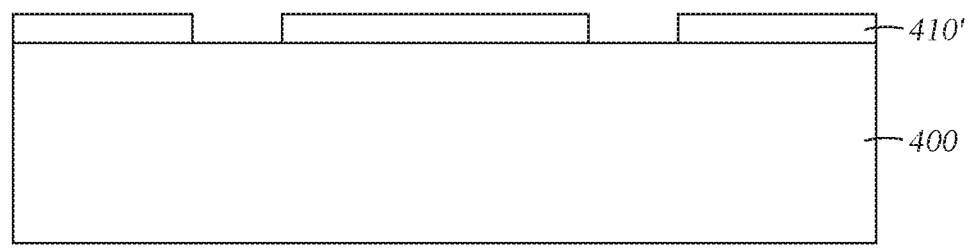

The hardmask formed by the method described above is used to transfer a pattern to the target layer disposed on the substrate, which involves several operations as shown in FIGS. 4D-4G. In FIG. 4D, a photo-resist layer 450 is disposed on and patterned over the hardmask 440 disposed on the bulk layer 430. In FIG. 4E, portions of the hardmask 440 are removed by etching through openings formed through the patterned photo-resist layer 450, transferring the pattern to the target layer 410. The hardmask 440 now is defined as a patterned hardmask 440' comprising a patterned seed layer 420' and a patterned bulk layer 430'. In FIG. 4F, the target layer 410 is etched away through the patterned hardmask 440', resulting in a patterned target layer 410'. Finally in FIG. 4G, the patterned hardmask 440' is removed for example by ashing to completely expose the patterned target layer 410'.

Figure 5:
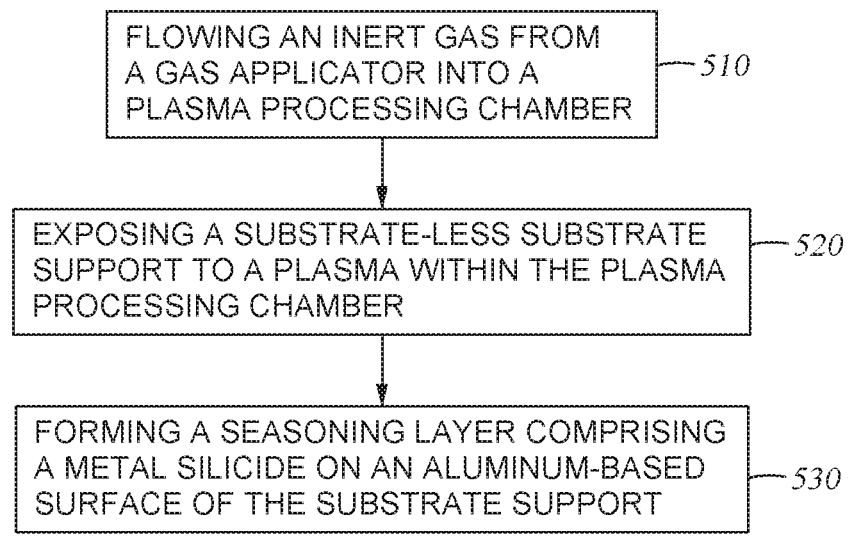
FIG. 5 is a block diagram of a method for conditioning the components of a plasma processing chamber, according to one embodiment of the disclosure.
Figure 6A:
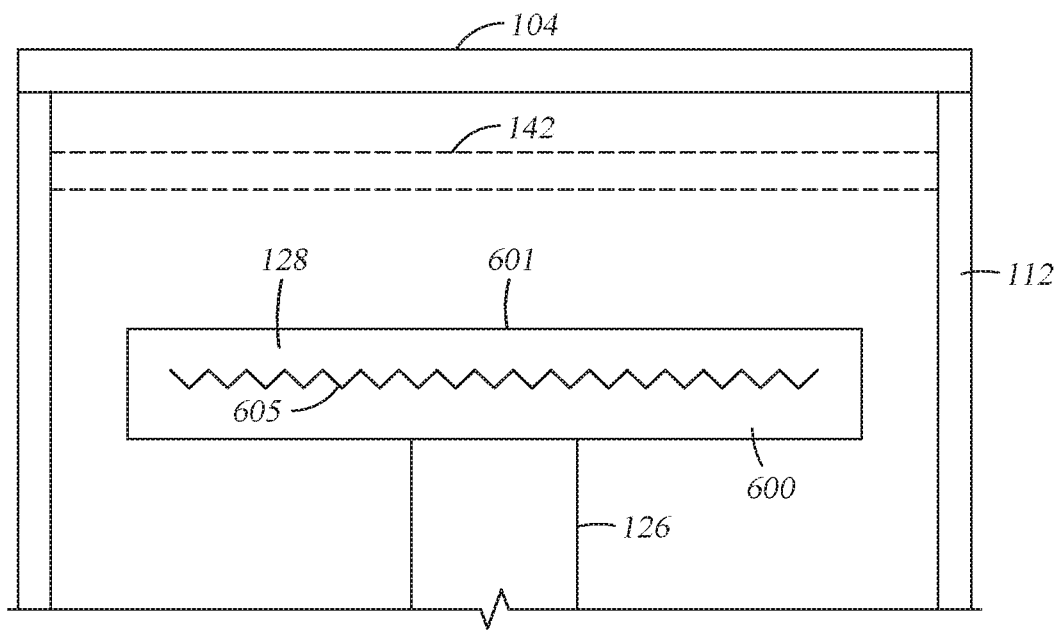
FIGS. 6A-6B depicts the two stages of conditioning the components of a plasma processing chamber, according to one embodiment of the disclosure.

FIG. 5 is a block diagram of the method 500 of conditioning the components of a plasma processing chamber, such as the substrate support 128 the processing chamber 100 described above, or other suitable processing chamber. The method 500 begins at block 510 by flowing an inert gas from a gas applicator into the plasma processing chamber that has the substrate support 128 disposed therein. The inert gas may be helium or argon. Referring additionally to FIG. 6A, the substrate support 128 has a body 600. The body 600 has a top surface 601 for supporting the substrate 121 thereon (as shown in FIG. 1). The body 600 has a heating element 605 (shown in FIGS. 6A-6B) embedded within.

At block 520, the substrate support 128 disposed within the processing chamber is exposed to a plasma within the plasma processing chamber. As shown in FIG. 6A, the substrate support 128 has no substrate disposed thereon when exposed to the plasma.

Figure 6B:
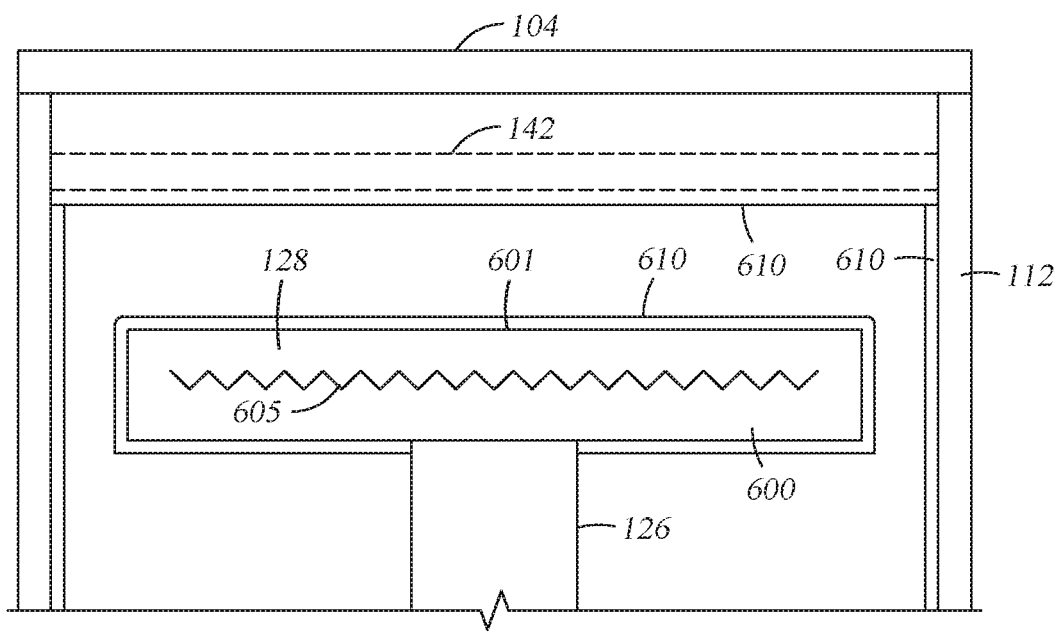

At block 530, a seasoning layer 610 is formed on an aluminum-based surface of the substrate support 128, as illustrated in FIG. 6B. The seasoning layer is deposited on the sides and under the substrate support 128, as shown in FIG. 6B. While the substrate support 128 is representative of a component of the chamber 100 that is conditioned by the seasoning layer 610, other components of the chamber 100 may also be conditioned using the seasoning layer 610. Such components of the chamber 100 may include chamber lid 104, the sidewalls 112, the bottom wall 116, the rod 130, lift pins 161, and the showerhead assembly 142, among others. As shown in FIG. 6B, the seasoning layer is also deposited on the showerhead assembly 142 and the sidewalls 112. The seasoning layer comprises a metal silicide, such as but not limited to tungsten silicide, titanium silicide or molybdenum silicide. In this disclosure, tungsten silicide is used as an example.

In some embodiments, formation of the tungsten silicide layer involves several operations. In the first operation, tungsten hexafluoride is flowed from a gas applicator into the chamber volume of the plasma processing chamber during a first interval of time. In some embodiments, the tungsten hexafluoride is mixed with argon. In the second operation, the tungsten hexafluoride and argon are removed from the plasma processing chamber during a second interval of time, with or without introduction of an inert purge gas. In the third operation, silane is flowed from the gas applicator into the chamber volume of the plasma processing chamber during a third interval of time. In some embodiments, the silane is mixed with helium. In the fourth operation, the silane and helium are then removed from the plasma processing chamber during a fourth interval of time, with or without introduction of an inert purge gas. The first, the second, the third, and the fourth intervals of time may have a duration of between about 0.1 seconds to about 100 seconds. Combined, the first, the second, the third, and the fourth intervals of time define a time cycle. In some embodiments, the first time interval and the third time interval are the same, are different or change in duration with each time cycle. The time cycle including the first, the second, the third, and the fourth operations is repeated a plurality of times until a layer of tungsten silicide is deposited on the substrateless substrate support and other components of the chamber to desired thickness. The thickness of the seasoning layer of tungsten silicide is between about 10 nm to about 10 micron (10000 nm).

The disclosure demonstrates methods and apparatus for depositing a thin metal silicide layer on a substrate that enables the formation of thick tungsten-based hardmask layers on a substrate. Fluoride radicals introduced into the chamber causes tungsten-based hardmask layers to peel away from silicon-based substrates due to adhesion and stress mismatches between the tungsten-based hardmask and the silicon-based substrate. However, the thin metal silicide seed layer deposited on the silicon-based substrate prior to deposition of the thick tungsten-based layer traps the fluoride radicals, thus substantially inhibiting fluorine from reaching the surface below the seed layer. The thin metal silicide seed layer also delivers sufficient stress relaxation due to homogeneity between the tungsten-based hardmask layer and the silicon-based substrate. Thus, a variety of thick tungsten-based layers doped with various amounts of boron, carbon, nitrogen and silicon can be deposited on the silicon-based substrate. As a result, the tungsten-based layer adheres well to the silicon-based substrate due to the thin metal silicide seed layer, which enables subsequent etching processes to be performed without the tungsten-based layer peeling off. The thin metal silicide seed layer also removes elements that are incompatible with subsequent etch processes.

The disclosure further demonstrates methods and apparatus for depositing a thin metal silicide seasoning layer on chamber components to prevent the formation of $AlF_x$ on the chamber components. $AlF_x$ causes process drifts and particle contamination on the substrates, thus making the cleaning thereof less effective. The thin metal silicide seasoning layer deposited using the gas applicator described herein mitigates the formation of particles and prevents contamination of the substrates. At the same time, since the metal silicide seasoning layer adheres well to the aluminum-based surfaces of the chamber components, any fluoride ions introduced subsequently into the chamber are trapped within the metal silicide seasoning layer and do not react with any aluminum-based surface to form $AlF_x$.

While the foregoing is directed to particular embodiments of the present disclosure, it is to be understood that these embodiments are merely illustrative of the principles and applications of the present disclosure. It is therefore to be understood that numerous modifications may be made to the illustrative embodiments to arrive at other embodiments without departing from the spirit and scope of the present disclosure, as defined by the appended claims.

What is claimed is:

1. A method of forming a hardmask on a substrate comprising:
    positioning the substrate having a target layer within a processing chamber;
    forming a seed layer comprising a metal silicide on the target layer, the forming the seed layer comprising:
        (A) flowing a metal hexafluoride from a gas applicator into the processing chamber for a first interval of time;
        (B) removing the metal hexafluoride from the processing chamber for a second interval of time;
        (C) flowing silane from the gas applicator into the processing chamber for a third interval of time;
        (D) removing the silane from the processing chamber for a fourth interval of time, the first, second, third and fourth intervals of time comprising a time cycle; and
        (E) repeating (A), (B), (C) and (D); and
    depositing a tungsten-based bulk layer on the seed layer, the metal silicide layer and the tungsten-based bulk layer forming the hardmask.
2. The method of claim 1, wherein the first interval of time and the third interval of time increase with each repetition.
3. The method of claim 1, wherein each of the first, second, third and fourth intervals of time are between about 0.1 seconds to about 100 seconds.
4. The method of claim 1, further comprising:
    exposing the target layer to silane prior to forming the seed layer.
5. The method of claim 1, further comprising:
    patterning the hardmask to form a patterned hardmask;
    etching the target layer through the patterned hardmask; and
    removing the patterned hardmask.
6. The method of claim 1, wherein the target layer comprises at least one of silicon oxide, silicon nitride, amorphous silicon and polysilicon.
7. The method of claim 1, wherein the tungsten-based bulk layer comprises at least one of tungsten, tungsten carbide, tungsten nitride, tungsten carbonitride, tungsten boron carbide and tungsten boron nitride.
8. The method of claim 1, wherein a thickness of the seed layer is between about 1 nm to about 100 nm.
9. The method of claim 1, wherein a thickness of the tungsten-based bulk layer is between about 10 nm to about 5000 nm.
10. The method of claim 1, wherein the seed layer comprises tungsten silicide, titanium silicide, or molybdenum silicide.
11. The method of claim 1, wherein forming the seed layer further comprises:
    forming a silicon-rich seed layer.
12. The method of claim 1, wherein a density of the seed layer is from about 1.8 g/cc to about 15 g/cc at room temperature.
13. A method of forming a hardmask on a substrate comprising:
    positioning the substrate having a target layer within a processing chamber;
    flowing an inert gas from a gas applicator into the processing chamber, the inert gas comprising argon or helium;
    energizing a plasma within the processing chamber; and
    forming a seed layer comprising a metal silicide on the target layer in presence of the plasma; and
    depositing a tungsten-based bulk layer on the seed layer, the metal silicide layer and the tungsten-based bulk layer forming the hardmask.
14. The method of claim 13, wherein forming the seed layer comprises:
    (A) flowing a metal hexafluoride mixed with argon from the gas applicator into the processing chamber for a first interval of time;
    (B) removing the metal hexafluoride mixed with argon from the processing chamber for a second interval of time;
    (C) flowing silane mixed with helium from the gas applicator into the processing chamber for a third interval of time;
    (D) removing the silane mixed with helium from the processing chamber for a fourth interval of time, the first, second, third and fourth intervals of time comprising a time cycle; and
    (E) repeating (A), (B), (C) and (D).
15. The method of claim 13, further comprising:
    exposing the target layer to silane prior to forming the seed layer.
16. The method of claim 13, further comprising:
    patterning the hardmask to form a patterned hardmask;
    etching the target layer through the patterned hardmask; and
    removing the patterned hardmask.
17. A method of forming a hardmask on a substrate comprising:
    positioning the substrate having a target layer within a processing chamber;

flowing an inert gas from a gas applicator into the processing chamber, the inert gas comprising argon or helium;

energizing a plasma within the processing chamber; and forming a seed layer comprising a metal silicide on the target layer, the forming the seed layer comprising flowing tungsten hexafluoride, argon, helium, and silane into the processing chamber; and depositing a tungsten-based bulk layer on the seed layer, the metal silicide layer and the tungsten-based bulk layer forming the hardmask.

18. The method of claim 17, wherein the target layer comprises at least one of silicon oxide, silicon nitride, amorphous silicon and polysilicon.

19. The method of claim 17, wherein the tungsten-based bulk layer comprises at least one of tungsten, tungsten carbide, tungsten nitride, tungsten carbonitride, tungsten boron carbide and tungsten boron nitride.

20. The method of claim 17, wherein the thickness of the seed layer is between about 1 nm to about 100 nm.

* * * * *